US010879158B2

(12) United States Patent
Patil et al.

(10) Patent No.: US 10,879,158 B2
(45) Date of Patent: Dec. 29, 2020

(54) SPLIT CONDUCTIVE PAD FOR DEVICE TERMINAL

(71) Applicant: QUALCOMM Incorporated, San Diego, CA (US)

(72) Inventors: Aniket Patil, San Diego, CA (US); Hong Bok We, San Diego, CA (US); Kuiwon Kang, San Diego, CA (US); Zhijie Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/424,700

(22) Filed: May 29, 2019

(65) Prior Publication Data

US 2020/0381344 A1 Dec. 3, 2020

(51) Int. Cl.
| | |
|---|---|
| *H01L 23/52* | (2006.01) |
| *H01L 23/498* | (2006.01) |
| *H01L 23/538* | (2006.01) |
| *H01L 25/16* | (2006.01) |
| *H01L 21/48* | (2006.01) |
| *H01L 23/00* | (2006.01) |

(52) U.S. Cl.
CPC .... *H01L 23/49811* (2013.01); *H01L 21/4853* (2013.01); *H01L 21/4857* (2013.01); *H01L 23/5383* (2013.01); *H01L 23/5386* (2013.01); *H01L 24/19* (2013.01); *H01L 24/24* (2013.01); *H01L 25/16* (2013.01); *H01L 24/16* (2013.01); *H01L 2224/16227* (2013.01); *H01L 2224/16238* (2013.01); *H01L 2224/24265* (2013.01); *H01L 2924/19041* (2013.01); *H01L 2924/19042* (2013.01); *H01L 2924/19043* (2013.01); *H01L 2924/19102* (2013.01); *H01L 2924/19105* (2013.01)

(58) Field of Classification Search
CPC ............. H01L 21/4853; H01L 21/4857; H01L 23/5383; H01L 23/5386; H01L 23/49811; H01L 24/19; H01L 24/24
USPC ......................................................... 257/774
See application file for complete search history.

(56) References Cited

U.S. PATENT DOCUMENTS

| | | | |
|---|---|---|---|
| 8,101,866 B2* | 1/2012 | Hsu ........................ | H01L 23/498 174/257 |
| 9,177,899 B2* | 11/2015 | Lin ......................... | H01L 23/498 |
| 9,269,688 B2* | 2/2016 | Wu ..................... | H01L 23/49894 |
| 9,318,458 B2* | 4/2016 | Chang ..................... | H01L 24/16 |

* cited by examiner

*Primary Examiner* — Luan C Thai
(74) *Attorney, Agent, or Firm* — Patterson & Sheridan, L.L.P

(57) ABSTRACT

Certain aspects of the present disclosure generally relate to a chip package having a split conductive pad for coupling to a device terminal. An example chip package generally includes a layer, a first plurality of conductive pads disposed on the layer, at least one conductive trace disposed on the layer and between the first plurality of conductive pads, and an electrical component having a first terminal coupled to the first plurality of conductive pads and disposed above the at least one conductive trace.

20 Claims, 14 Drawing Sheets

SPLIT CONDUCTIVE PAD FOR DEVICE TERMINAL

BACKGROUND

Field of the Disclosure

Certain aspects of the present disclosure generally relate to electronic circuits and, more particularly, to layout improvements for integrated circuit packages using a split conductive pad with a conductive trace disposed between the conductive pad.

Description of Related Art

As electronic devices are getting smaller and faster, the demand for integrated circuit (IC) packages with higher I/O count, faster data processing rate, and better signal integrity greatly increases. The IC package may include a die disposed on a carrier such as a laminate substrate or printed circuit board (PCB). The IC packages often include various surface mount electrical components including capacitors, inductors, and resistors. Due to constraints such as the electrical component size and integrated circuit fabrication process limitations, some electrical components are not fabricated on-die (e.g., on an integrated circuit), but are instead coupled to the die via surface mounts including land-side or die-side conductive pads on the IC package. For example, the conductive pads may be disposed on the laminate substrate or the PCB having a redistribution layer coupled to the die.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include improved conductive trace layouts for integrated circuit packages.

Certain aspects of the present disclosure provide a chip package. The chip package generally includes a layer, a first plurality of conductive pads disposed on the layer, at least one conductive trace disposed on the layer and between the first plurality of conductive pads, and an electrical component having a first terminal coupled to the first plurality of conductive pads and disposed above the at least one conductive trace.

Certain aspects of the present disclosure provide a method of fabricating a chip package. The method generally includes forming a first plurality of conductive pads on a layer, forming at least one conductive trace on the layer and between the first plurality of conductive pads, and coupling a first terminal of an electrical component to the first plurality of conductive pads, wherein the electrical component is disposed above the at least one conductive trace.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
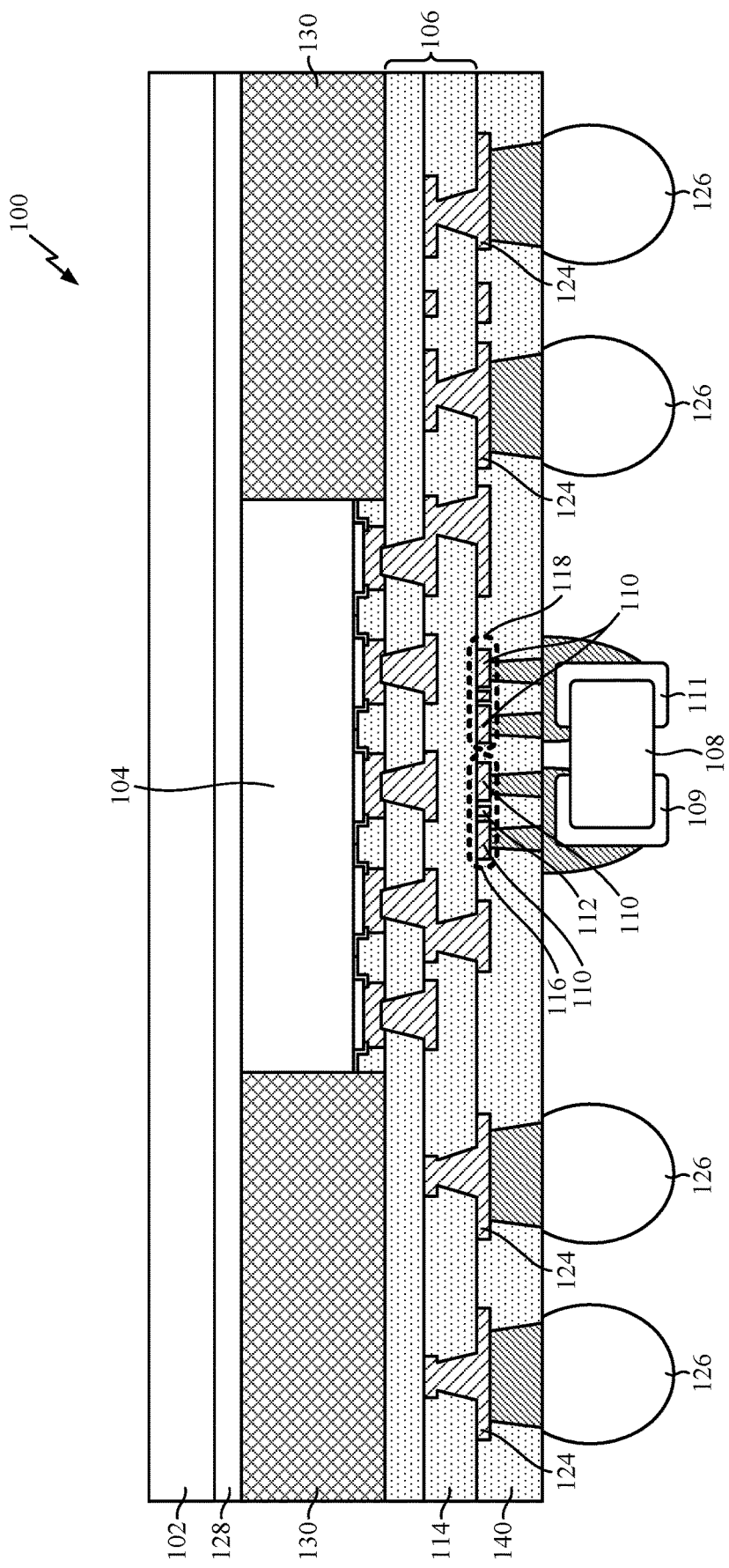
FIG. 1 is a cross-sectional view of an example chip package having split conductive pads, in accordance with certain aspects of the present disclosure.

Aspects of the present disclosure generally relate to a chip package with improved conductive layer routing provided by a split conductive pad for coupling to a terminal of an electrical component, including but not limited to a surface-mount electrical device such as an inductor, capacitor, or resistor. As further described herein, the split conductive pad may include a plurality of pads disposed on a layer. One or more conductive traces may be routed between the plurality of pads on the same layer to enable efficient use of the layout space, improved signal integrity, and enhanced power integrity.

Example Chip Package with a Split Conductive Pad

In the micro-electronic technology industry, there is a continuous demand and evolution of processes, technologies, and assembly methodologies to design and implement smaller, more efficient IC packages (also referred to as a chip package). To achieve the smaller package size, the IC package may be fabricated with fine architectural designs inside and outside a package substrate. For instance, fine architectural designs may include smaller interconnect feature sizes and design rules such as a minimum metal trace width, a minimum metal trace spacing, a conductive via pad size, a via drill size, a reduced die bump pitch, or a reduced PCB level interconnect pin pitch.

Semiconductor devices that consume high levels of power may benefit from having passive components (such as a capacitor, inductor, or resistor) coupled nearby the semiconductor devices to improve power distribution and reduce parasitic losses. The passive components may be coupled to the IC package as surface-mount devices. Although design features in the IC package have minimized in size (e.g., trace width, trace spacing, via size, and pin pitch), the terminals of the surface-mount components have not decreased in size proportionally with respect to the features of the semiconductor packaged device. The larger terminals on the surface mount components correspond to relatively large conductive pads on the IC package compared to other features, such as the conductive traces of the IC package. As a result, the conductive pads for receiving the surface-mount terminals occupy a large space compared to other features (such as conductive traces) with respect to the IC package floorplan. As such, the conductive pads may restrict the routing options for conductive traces and through hole vias. For example, the conductive pads may have a size that is at least ten times larger than other design features, such as a conductive trace width.

Certain aspects of the present disclosure generally relate to a chip package that has a split conductive pad to provide a coupling surface between a redistribution layer and a device terminal (e.g., the terminal of a surface mount capacitor). The split conductive pad may include multiple conductive pads physically separated from each other, but electrically coupled together, as further described herein with respect to FIGS. 3A-3D, for example. A single terminal of the electrical component is meant to couple to the multiple separate conductive pads in the split conductive pad. The split conductive pad described herein may enable improved layout space, signal integrity, and/or power integrity.

Figure 2A:
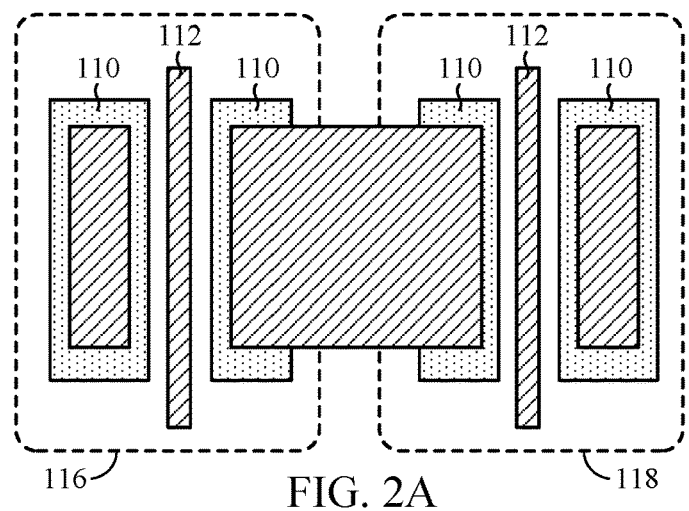
FIG. 2A is a top view of example split conductive pads, in accordance with certain aspects of the present disclosure.
Figure 2B:
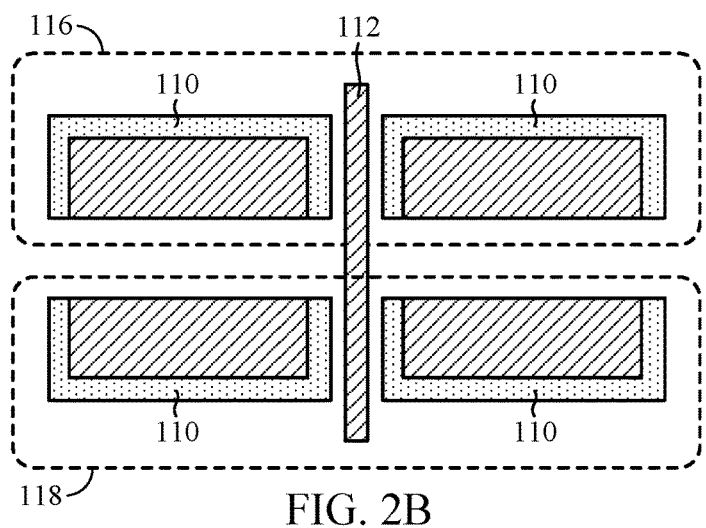
FIG. 2B is a top view of other example split conductive pads, in accordance with certain aspects of the present disclosure.

The split conductive pad may allow for more efficient conductive trace routing through the split conductive pad as described herein with respect to FIGS. 2A and 2B. For example, the split conductive pad may simplify conductive trace routing options by using less space for the coupling to the device terminal and making more space available for conductive traces.

The split conductive pad described herein may also provide improved signal integrity. For example, routing through the split conductive pad may reduce or eliminate bends in a conductive trace, which may generate a parasitic impedance or reactance, thus improving the signal integrity of the conductive trace. Routing through the split conductive pad may also provide electrical benefits such as improved isolation, especially where the conductive trace is routed through a split pad coupled to a ground terminal. For instance, the split pad coupled to the ground terminal may reduce or eliminate crosstalk from forming on the conductive trace. As another example of improved signal integrity, as the split conductive pad is reduced in size compared to a full conductive pad, the split conductive pad may reduce coupling effects or crosstalk on other conductive layers of the IC package.

The split conductive pad described herein may provide improved power integrity. For example, the power distribution network for power rails may be improved by increasing the connection space for voltage and/or ground reference rails. In other aspects, the power distribution network may be improved by providing more than one power network in the same conductive pad space, as further described herein, with respect to FIG. 2C.

FIG. 1 is a cross-sectional view of an example chip package 100 having split conductive pads, in accordance with certain aspects of the present disclosure. As shown, the chip package 100 may include a chip carrier 102, a die 104, one or more redistribution layers 106, an electrical component 108, a split conductive pad 116 or 118, and at least one conductive trace 112. The chip package 100 may be, for example, a fan-out wafer level package. Hereinafter, the split conductive pad 116 may be referred to as the first split conductive pad 116, and the other split conductive pad 118 may be referred to as the second split conductive pad 118.

The split conductive pads 116, 118 and conductive trace(s) 112 may be disposed on a layer 114 of the one or more redistribution layers 106. In certain aspects, the layer 114 may be a dielectric layer of the one or more redistribution layers 106. A layer of solder resist 140 may be disposed above the one or more redistribution layers 106.

The first split conductive pad 116 may include a first plurality of conductive pads 110, which may couple to a first terminal 109 of the electrical component 108, and the second split conductive pad 118 may include a second plurality of conductive pads 110, which may couple to a second terminal 111 of the electrical component 108. In at least one of the split conductive pads 116, 118, one or more traces 112 may be routed between the plurality of conductive pads 110 composing the split conductive pad (i.e., routed through the split conductive pad). In certain aspects, the plurality of conductive pads 110 may be coupled to a reference voltage, such as ground, and provide electrical isolation to the conductive trace(s) 112 routed through the split conductive pads 116, 118.

The electrical component 108 may be a surface-mount electrical device coupled to the chip package 100 on the land side or die side as further described herein. For instance, the electrical component 108 may be a passive surface-mount electrical device such as a capacitor, inductor, or resistor. As shown in this example, the electrical component 108 is coupled to the chip package 100 on the land side, as opposed to the die side. The first terminal 109 may be coupled to the split conductive pad 116 and disposed above the conductive trace 112 (e.g., may overlap the trace, and more specifically the width of the trace). That is, the first terminal 109 may be coupled to at least some, if not all, of the plurality of pads 110 composing the first split conductive pad 116, but is not electrically coupled to the conductive trace 112. The second terminal 111 may be coupled to the second split conductive pad 118 and disposed above another one of the conductive traces 112. In other words, the second terminal 111 may be coupled to at least some, if not all, of the plurality of pads 110 composing the second split conductive pad 118, but not electrically coupled to the other conductive trace 112 routed through the second split conductive pad 118. In certain aspects, the same conductive trace may be routed between the split conductive pads 116, 118 as further described herein with respect to FIG. 2B.

Under bump conductors 124 (e.g., under bump metallization (UBM) pads) may be disposed on the same layer 114 as the split conductive pads 116, 118. In certain aspects, the conductive traces 112 may provide fan-out connections to the under bump conductors 124, where the split conductive pads 116, 118 provide more efficient routing options for the fan-out traces to the under bump conductors 124. Solder bumps 126 may be disposed above the under bump conductors 124. The solder bumps 126 may enable the chip package 100 to be mounted to external circuitry, such as a circuit board or another chip or wafer.

The chip package 100 may also include a conductive layer 128 disposed between the die 104 and the chip carrier 102. The conductive layer 128 may be conductive shielding, such as a ground plane or a conductive foil (e.g., copper foil). In certain aspects, the conductive layer 128 may be a heat spreader that dissipates heat from the die 104.

The chip carrier 102 may provide a structure for packaging the die 104 at the wafer level and post-fabrication. The chip carrier 102 may be, for example, a glass carrier or silicon carrier. The chip carrier 102 may be removed or thinned after fabricating the chip package 100. The die 104 may be encapsulated in the chip package 100 by a molding compound 130. The molding compound 130 may be an epoxy resin, for example.

Figure 2C:
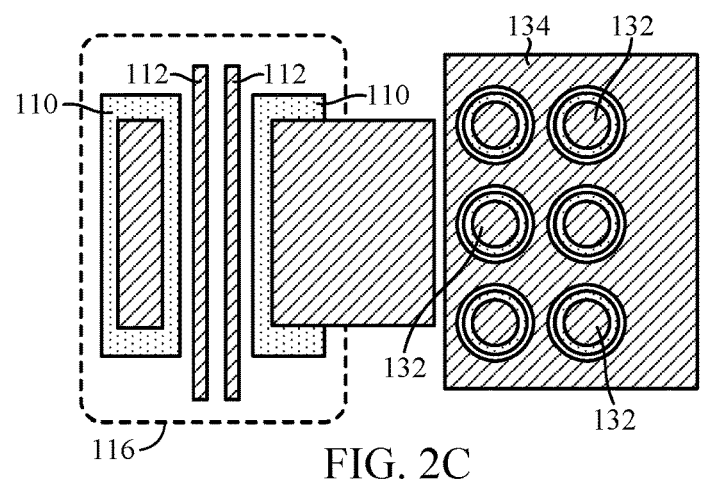
FIG. 2C is a top view of an example split conductive pad and conductive via pads, in accordance with certain aspects of the present disclosure.
Figure 5A:
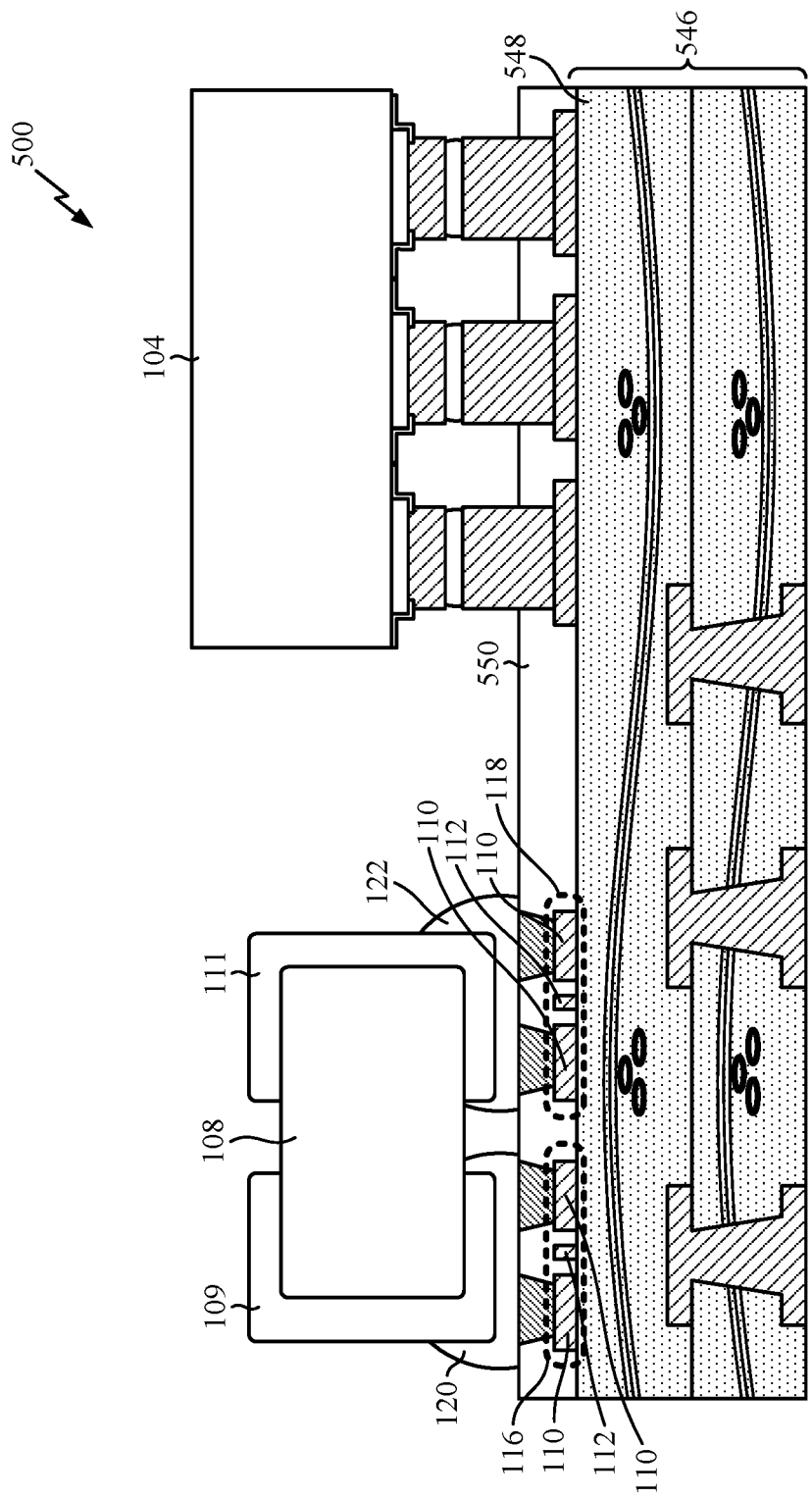
FIG. 5A is a cross-sectional view of an example electrical component coupled to split conductive pads on a die-side of a chip package, in accordance with certain aspects of the present disclosure.
Figure 5B:
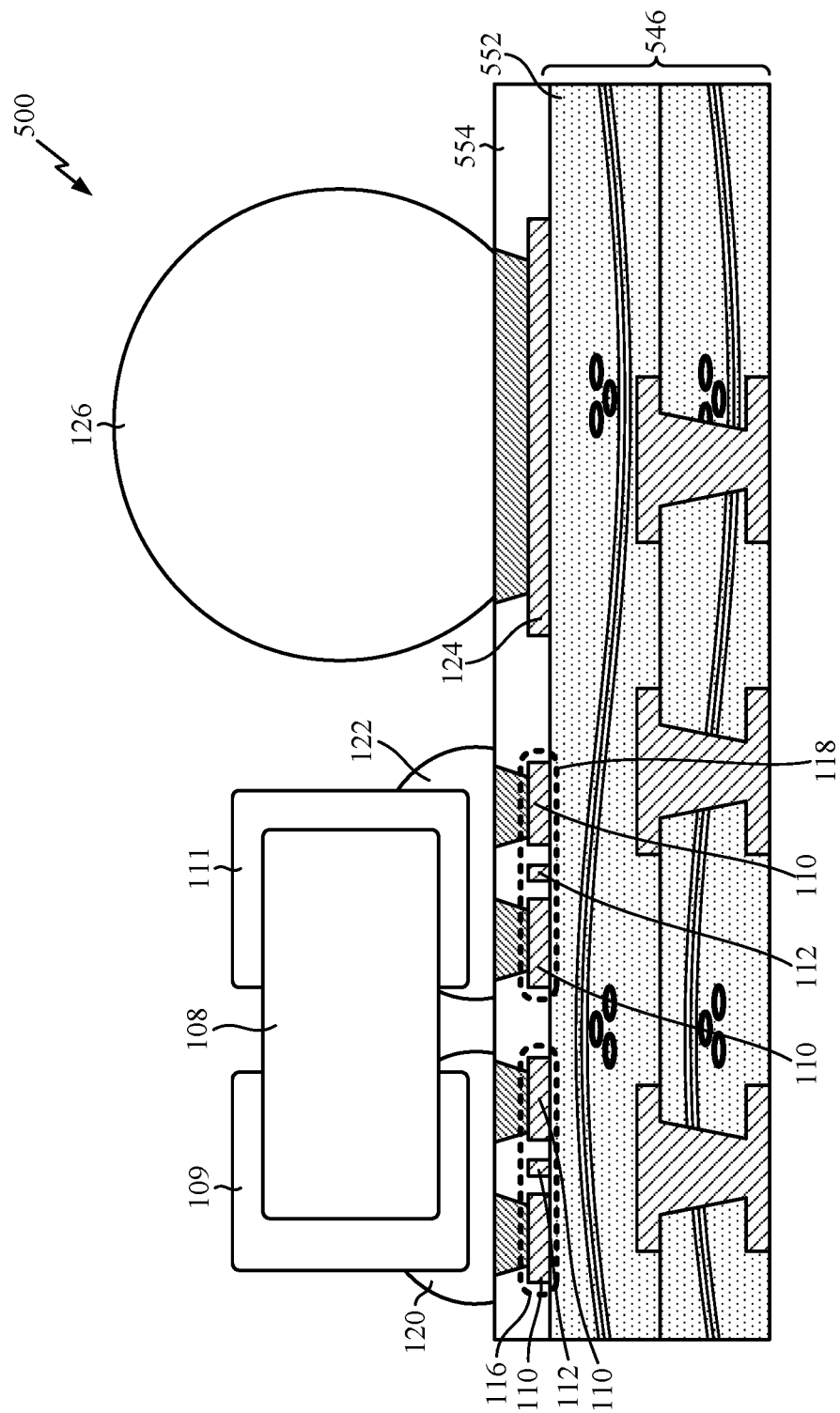
FIG. 5B is a cross-sectional view of an example electrical component coupled to split conductive pads on a land-side of a chip package, in accordance with certain aspects of the present disclosure.
Figure 7:
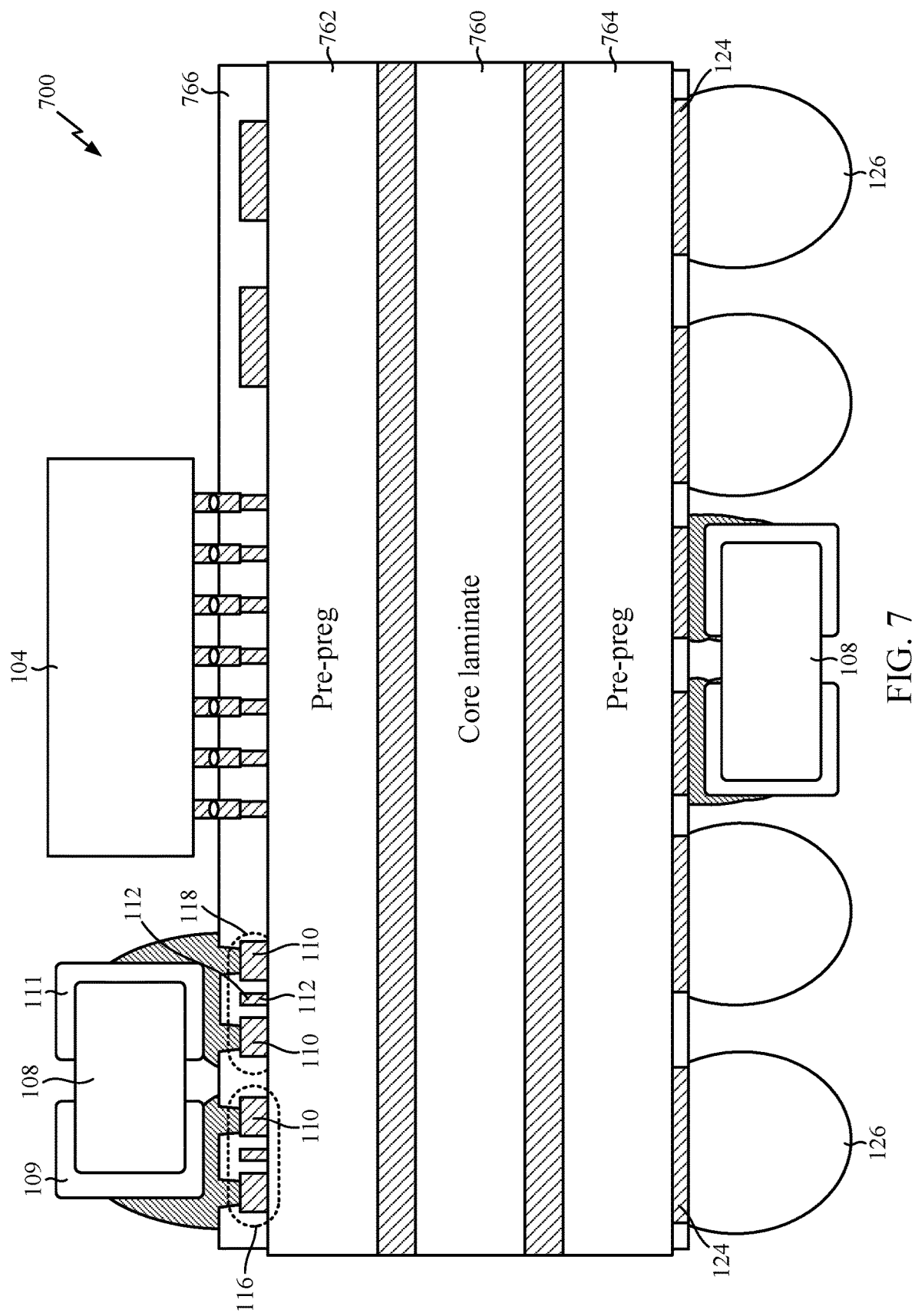
FIG. 7 is a cross-sectional view of an example electrical component coupled to split conductive pads on a die-side of a chip package with a core substrate, in accordance with certain aspects of the present disclosure.

FIGS. 2A-2C illustrate top views of various example split conductive pads disposed on a layer (e.g., the layer 114), in accordance with certain aspects of the present disclosure. The example split conductive pads depicted in FIGS. 2A-2C may be applied to any suitable chip package, including but not limited to a laminate substrate package, a wafer-level package, a fan-out wafer-level chip package (e.g., as depicted in FIG. 1), a coreless substrate chip package (e.g., as depicted in FIGS. 5A and 5B), or a core substrate chip package (e.g., as depicted in FIG. 7).

As shown in FIG. 2A, one of the conductive traces 112 may be disposed between individual conductive pads 110 in the first split conductive pad 116, which may be coupled to the first terminal of the electrical component, on the layer. The other conductive trace 112 may be disposed between individual conductive pads 110 in the second split conductive pad 118, which may be coupled to the second terminal of the electrical component, on the layer. As demonstrated in FIG. 2A, instead of routing a trace around the conductive pads, the split conductive pads 116, 118 enable the conductive traces 112 to be routed through each of the split conductive pads 116, 118 providing more routing options for the chip package.

Referring to FIG. 2B, the conductive trace 112 may be disposed between individual conductive pads 110 in the first split conductive pad 116 and the second split conductive pad 118 on the layer. In certain aspects, the same one or more conductive traces 112 may be routed through both sets of conductive pads (e.g., the first and second split conductive pads 116, 118) that couple to the separate terminals of the electrical component.

As depicted in FIG. 2C, multiple conductive traces 112 may be disposed between the individual conductive pads in the first split conductive pad 116, which may be coupled to the first terminal of the electrical component, on the layer. In certain aspects, conductive via pads 132 may be disposed on the same layer and coupled to the second terminal of the electrical component. The conductive via pads 132 may couple to through-hole vias (not shown) that are disposed through the layer. A power distribution pad 134 may be disposed on the layer and around at least one of the conductive via pads 132. The terminal of the electrical component coupled to the conductive via pads 132 may be partially disposed above the power distribution pad 134. That is, the second terminal of the electrical component may be coupled to the conductive via pads 132, but not electrically coupled to the power distribution pad 134.

The power distribution pad 134 may couple to other traces or through-hole vias (not shown) to enable improved power distribution and/or electrical isolation. For example, the power distribution pad 134 may provide a connection to ground, while the conductive via pads 132 may provide a connection to a power rail. In such a case, the conductive via pads 132 and the power distribution pad 134 provide access to multiple power networks in the same conductive pad space, which improves the power distribution options of the chip package.

FIGS. 3A-3D illustrate cross-sectional views of various examples of a split conductive pad configured to receive a terminal of an electrical component, in accordance with certain aspects of the present disclosure. The example split conductive pads depicted in FIGS. 3A-3D may be applied to any suitable chip package, including but not limited to a laminate substrate package, a wafer-level package, a fan-out wafer-level chip package (e.g., the chip package 100 depicted in FIG. 1), a coreless substrate chip package (e.g., as depicted in FIGS. 5A and 5B), or a core substrate chip package (e.g., as depicted in FIG. 7).

Figure 3A:
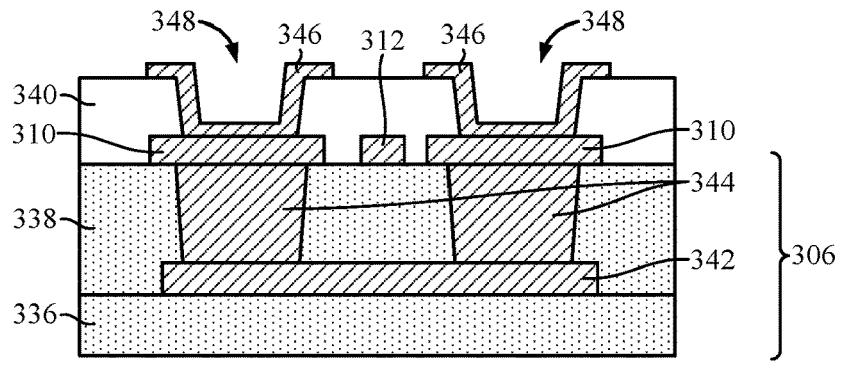
FIG. 3A is a cross-sectional view of a first example split conductive pad, in accordance with certain aspects of the present disclosure.

As shown in FIG. 3A, one or more redistribution layers 306 may include a first dielectric layer 336 and a second dielectric layer 338. A third dielectric layer 340 (such as the layer of solder resist 140) may be disposed above the one or more redistribution layers 306. The first and second dielectric layers 336, 338 may correspond to the dielectric layers in the one or more redistribution layers 106 depicted in FIG. 1. For instance, the second dielectric layer 338 may correspond to the layer 114 depicted in FIG. 1. The conductive pads 310 may correspond to the individual conductive pads (e.g., the conductive pads 110) in a split conductive pad, such as the first split conductive pad 116 or the second split conductive pad 118.

The conductive pad 310 and conductive trace 312 may be disposed on the second dielectric layer 338. Through-hole vias 344 may intersect the second dielectric layer 338 and couple to the conductive pads 310 and a first conductive layer 342 disposed on the first dielectric layer 336. The through-hole vias 344 and first conductive layer 342 may electrically couple the conductive pads 310 together to provide a physically separated, but electrically coupled split conductive pad. A second conductive layer 346 may be disposed in cavities 348 formed in the third dielectric layer 340. The individual features of the second conductive layer 346 may couple to the conductive pads 310 and the terminal of the electrical component.

Figure 3B:
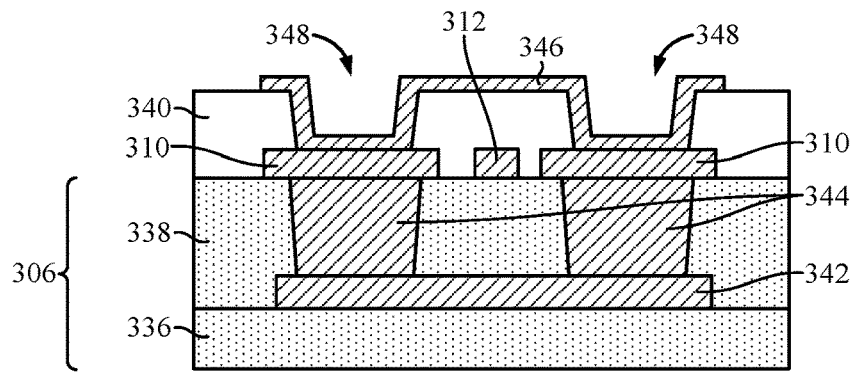
FIG. 3B is a cross-sectional view of a second example split conductive pad, in accordance with certain aspects of the present disclosure.

Referring to FIG. 3B, the second conductive layer 346 may be disposed on a portion of the third dielectric layer 340 that is between the cavities 348. The second conductive layer 346 may provide additional conductive surface area to electrically couple the conductive pads 310 and the electrical terminal of the electrical component.

Figure 3C:
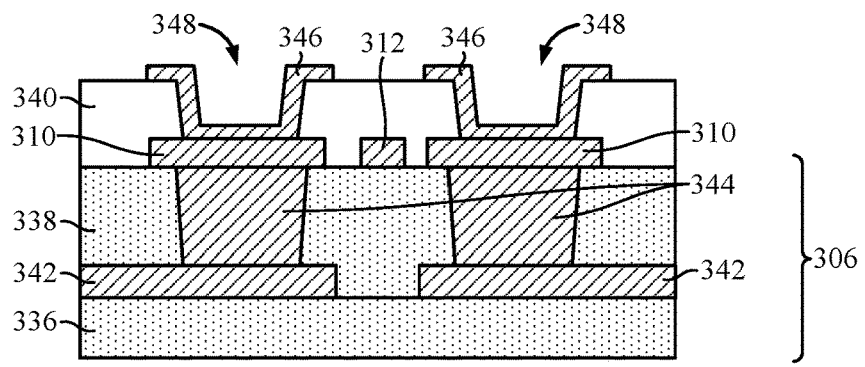
FIG. 3C is a cross-sectional view of a third example split conductive pad, in accordance with certain aspects of the present disclosure.

As depicted in FIG. 3C, the first conductive layer 342 may have separate features disposed on the first dielectric layer 336. The individual features of the first conductive layer 342 may provide routing options laterally spaced from the conductive pads 310. For example, the individual features of the first conductive layer 342 may couple to other conductive components (e.g., conductive traces, through-hole vias, etc.) laterally spaced from the conductive pads 310. Although the conductive pads 310 are physically and electrically isolated within the first, second, and third dielectric layers 336, 338, 340, the conductive pads 310 of the split conductive pad will be electrically coupled together when a terminal of an electrical component is coupled to the features of the second conductive layer 346.

Figure 3D:
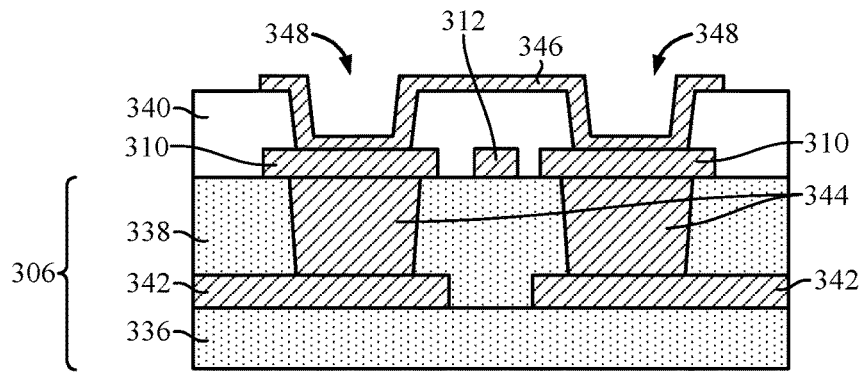
FIG. 3D is a cross-sectional view of a fourth example split conductive pad, in accordance with certain aspects of the present disclosure.

Referring to FIG. 3D, the second conductive layer 346 may be disposed on the third dielectric layer 340 as described herein with respect to FIG. 3B. The first conductive layer 342 may be disposed on the first dielectric layer as described herein with respect to FIG. 3C. As such, the conductive pads 310 depicted in FIG. 3D may benefit from the integral second conductive layer 346 and the laterally spaced features of the first conductive layer 342.

FIGS. 4A-4E illustrate example operations for fabricating a wafer-level fan-out chip package, in accordance with certain aspects of the present disclosure. The operations may be performed by an integrated circuit processing facility, for example.

Figure 4A:
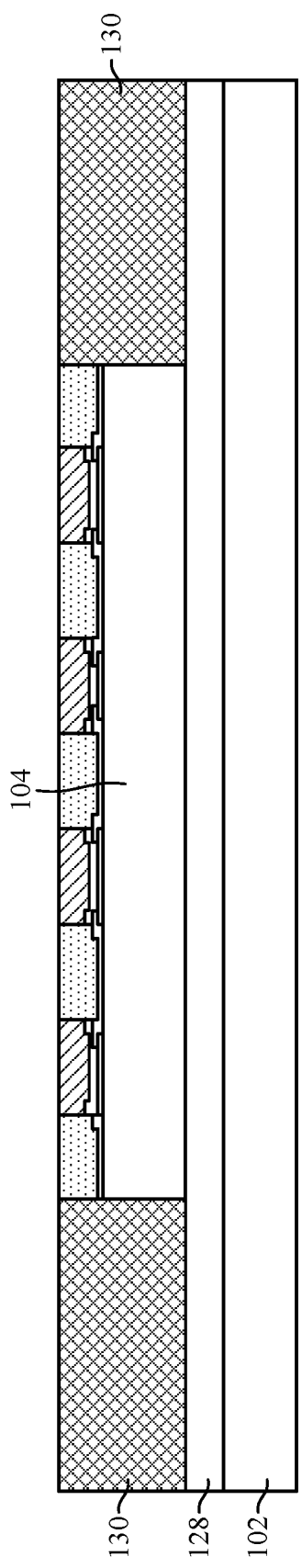
FIG. 4A is a cross-sectional view of a die disposed on a wafer level package, in accordance with certain aspects of the present disclosure.

As shown in FIG. 4A, the conductive layer 128 may be disposed above the chip carrier 102. The die 104 may be placed on the conductive layer 128, and the molding compound 130 may be formed around the die 104.

Figure 4B:
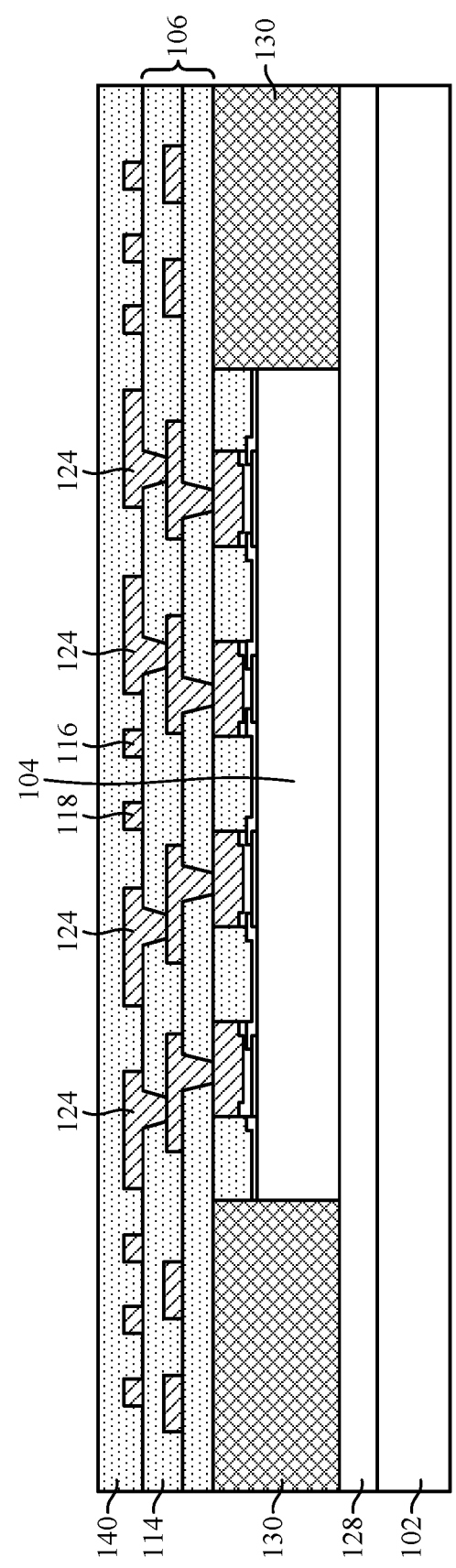
FIG. 4B is a cross-sectional view of a redistribution layer disposed above the die, in accordance with certain aspects of the present disclosure.

Referring to FIG. 4B, the one or more redistribution layers 106 may be formed above the molding compound 130 and the die 104. The one or more redistribution layers 106 may route electrical connections from the die 104 to the under bump conductors 124. The split conductive pads 116, 118 and one or more conductive traces (not shown) disposed through the split conductive pads 116, 118 may be formed on the layer 114 while forming the one or more redistribution layers 106. For instance, the split conductive pads 116, 118 and one or more conductive traces may be formed with the under bump conductors 124 on the layer 114. A layer of solder resist 140 may be formed above the one or more redistribution layers 106.

Figure 4C:
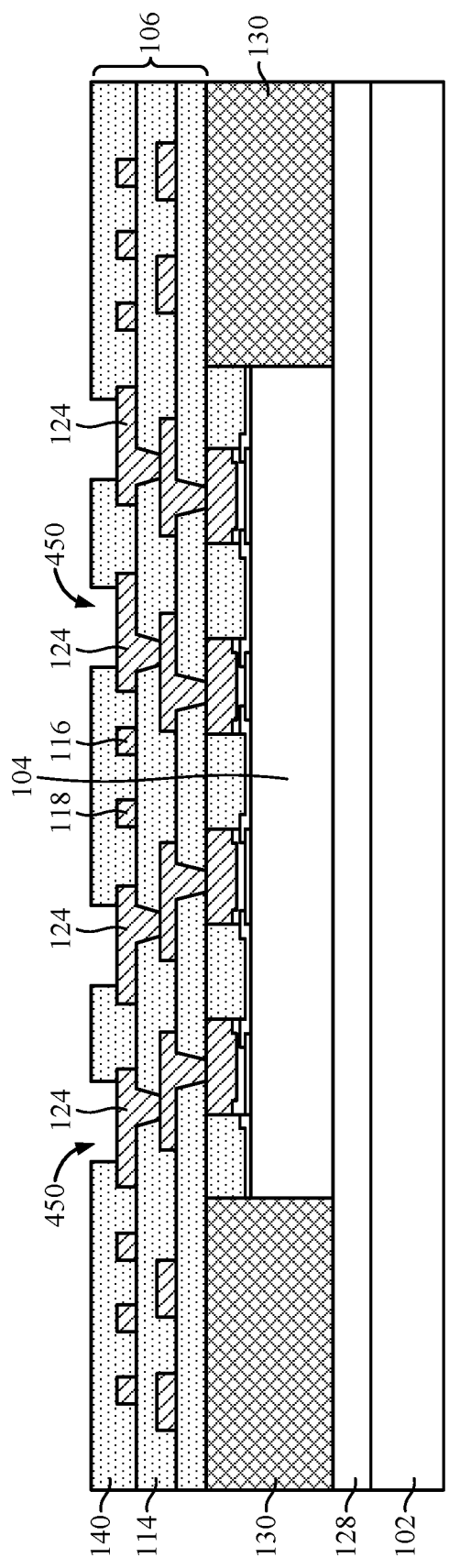
FIG. 4C is a cross-section view of the redistribution layer with cavities formed therein, in accordance with certain aspects of the present disclosure.

As illustrated in FIG. 4C, first cavities 450 may be formed in the layer of solder resist 140 disposed above the layer 114 to expose at least a portion of the under bump conductors 124. As an example, the layer of solder resist 140 may be selectively etched with a pattern that forms the first cavities 450 in the layer of solder resist 140 to expose the under bump conductors 124. The layer of solder resist 140 may correspond to the third dielectric layer 340 shown in FIGS. 3A-3D.

Figure 4D:
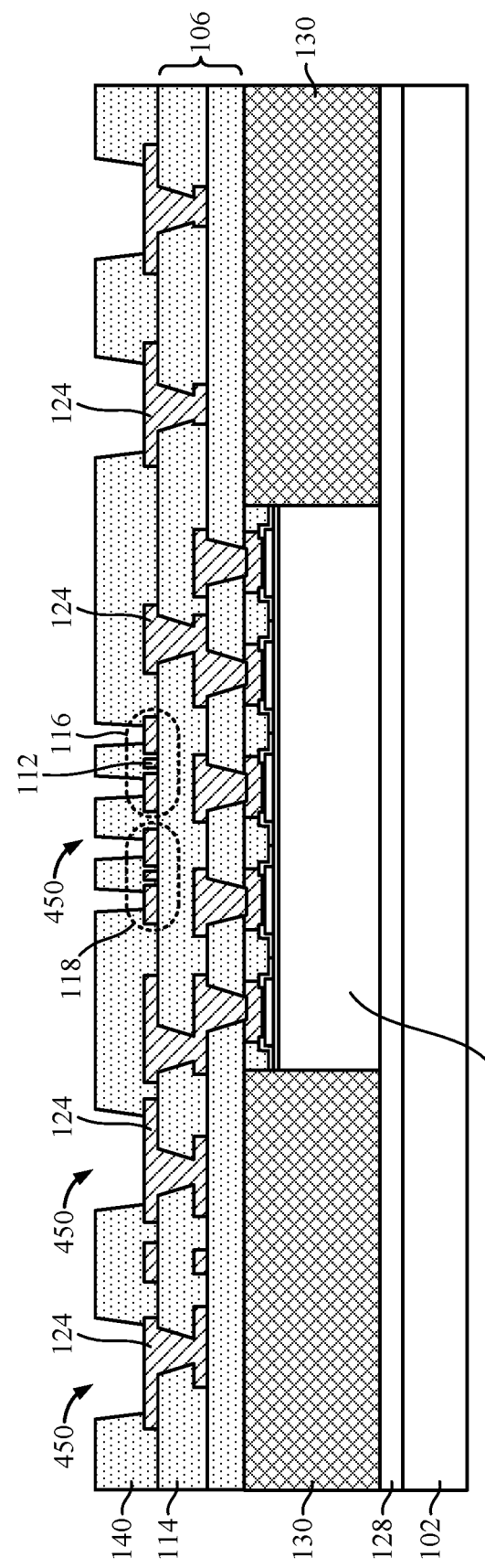
FIG. 4D is a cross-sectional view of the redistribution layer with additional cavities for the split conductive pads formed in the redistribution layer, in accordance with certain aspects of the present disclosure.

Referring to FIG. 4D, second cavities 452 may be formed in the layer of solder resist 140 to expose at least a portion of the split conductive pads 116, 118, but keep the conductive traces 112 covered with the layer of solder resist 140. As an example, the layer of solder resist 140 may be selectively etched with a pattern that forms the second cavities 452 in the layer of solder resist 140 to expose the split conductive pads 116, 118, such that the conductive traces 112 remain covered with the layer of solder resist 140. In certain aspects, a conductive layer may be formed inside the second cavities 452, such as the separate or integrated features of the second conductive layer 346 depicted in FIGS. 3A-3D.

Figure 4E:
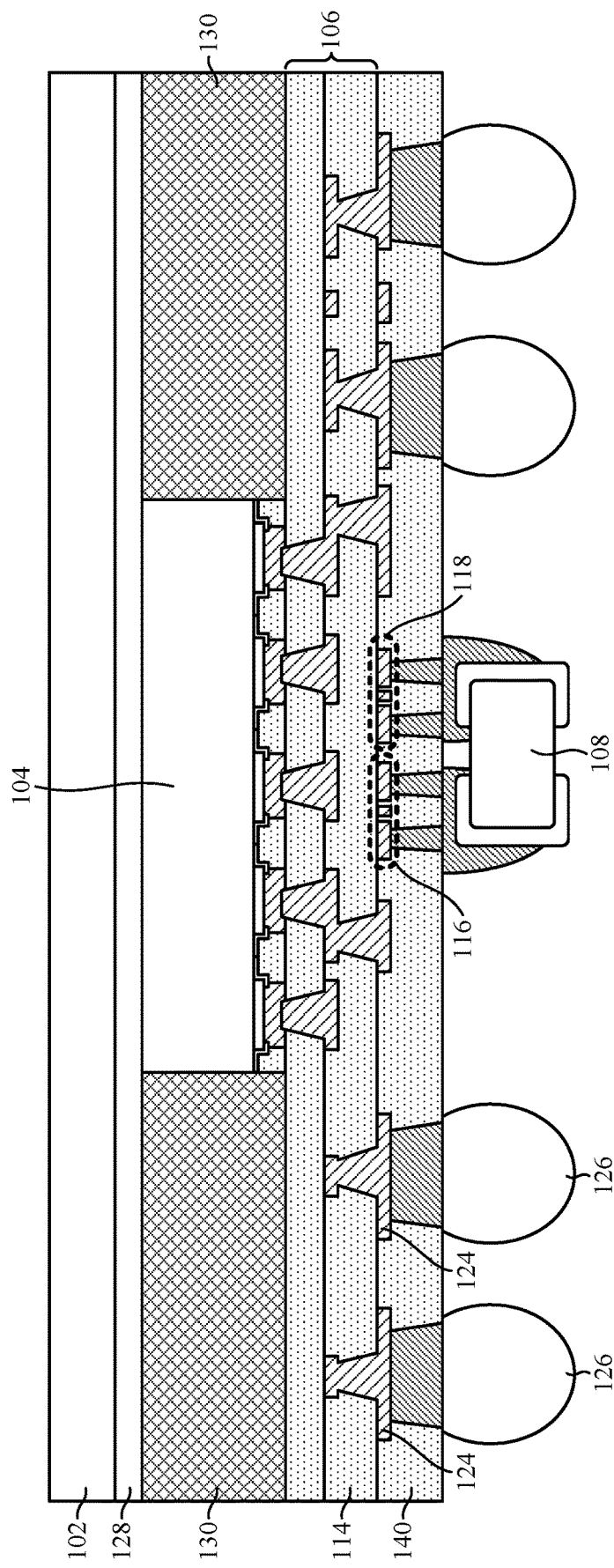
FIG. 4E is a cross-sectional view of an electrical component coupled to the split conductive pads on the land-side of the chip package, in accordance with certain aspects of the present disclosure.

As depicted in FIG. 4E, the electrical component 108 may be coupled to the split conductive pads 116, 118 as described herein with respect to FIG. 1. For instance, the first terminal 109 of the electrical component 108 may be soldered to the first split conductive pad 116 in the second cavities 452, and the second terminal 111 of the electrical component 108 may be soldered to the second split conductive pad 118 in the second cavities.

In certain aspects, the electrical component may be coupled to the split conductive pads on the die side of a chip package having a laminate substrate. For example, FIG. 5A illustrates a cross-sectional view of an example electrical component 108 coupled to split conductive pads 116, 118 on a die side of a laminate substrate, in accordance with certain aspects of the present disclosure. As shown, the chip package 500 may include one or more laminate substrate layers 546 having a first layer 548. The die 104 may be disposed above the first layer 548 on which the conductive pads 110 are also disposed. The split conductive pads 116, 118 may provide improved routing options, signal integrity, and/or power distribution on the die side of the chip package 500. A first layer of solder resist 550 may be disposed above the first layer 548. Solder joints 120, 122—connecting the first and second terminals 109, 111 of the electrical component to the conductive pads 110—may be disposed in cavities formed in the first layer of solder resist 550.

In certain aspects, the electrical component may be coupled to the split conductive pads on the land side of a chip package having a laminate substrate. For example, FIG. 5B illustrates a cross-sectional view of an example electrical component coupled to split conductive pads on a land side of the laminate substrate, in accordance with certain aspects of the present disclosure. As shown, the one or more laminate substrate layers 546 may include a second layer 552. The conductive pads 110 may be disposed on the second layer 552 on which the under bump conductors 124 may also be disposed. A second layer of solder resist 554 may be disposed on the second layer 552. The split conductive pads 116, 118 may provide improved routing options, signal integrity, and/or power distribution on the land-side of the chip package 500. In certain aspects, the electrical components 108 may be mounted to the chip package with split conductive pads on the die side, land side, or a combination of die side and land side.

Figure 6A:
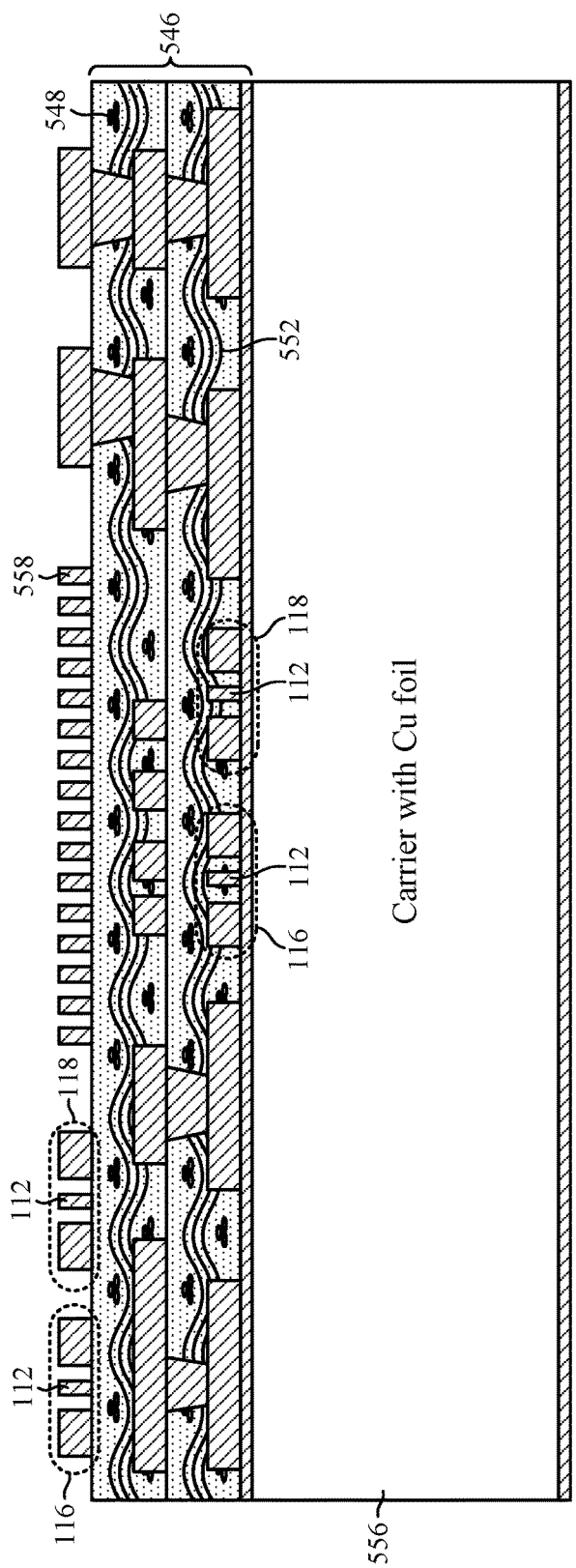
FIG. 6A is a cross-sectional view of conductive and dielectric layers formed on a carrier, in accordance with certain aspects of the present disclosure.
Figure 6B:
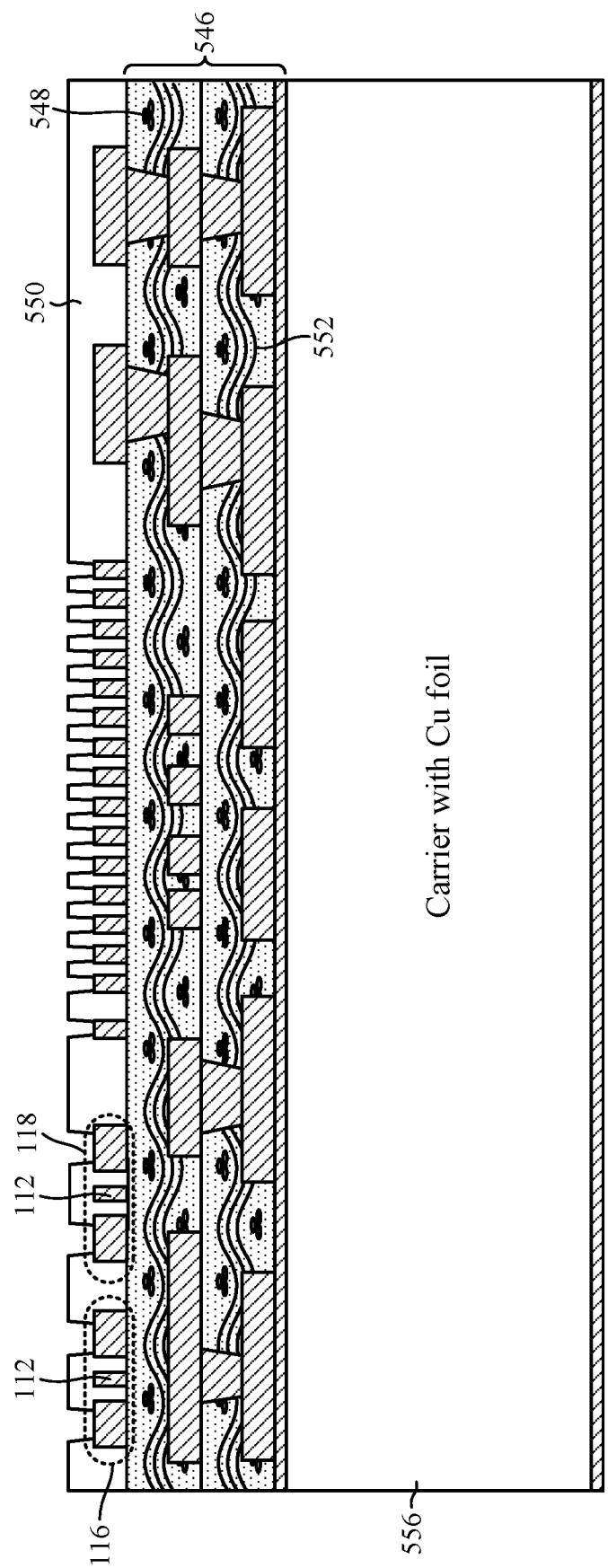
FIG. 6B is a cross-sectional view of a layer of solder resist disposed above one of the dielectric layers, in accordance with certain aspects of the present disclosure.
Figure 6C:
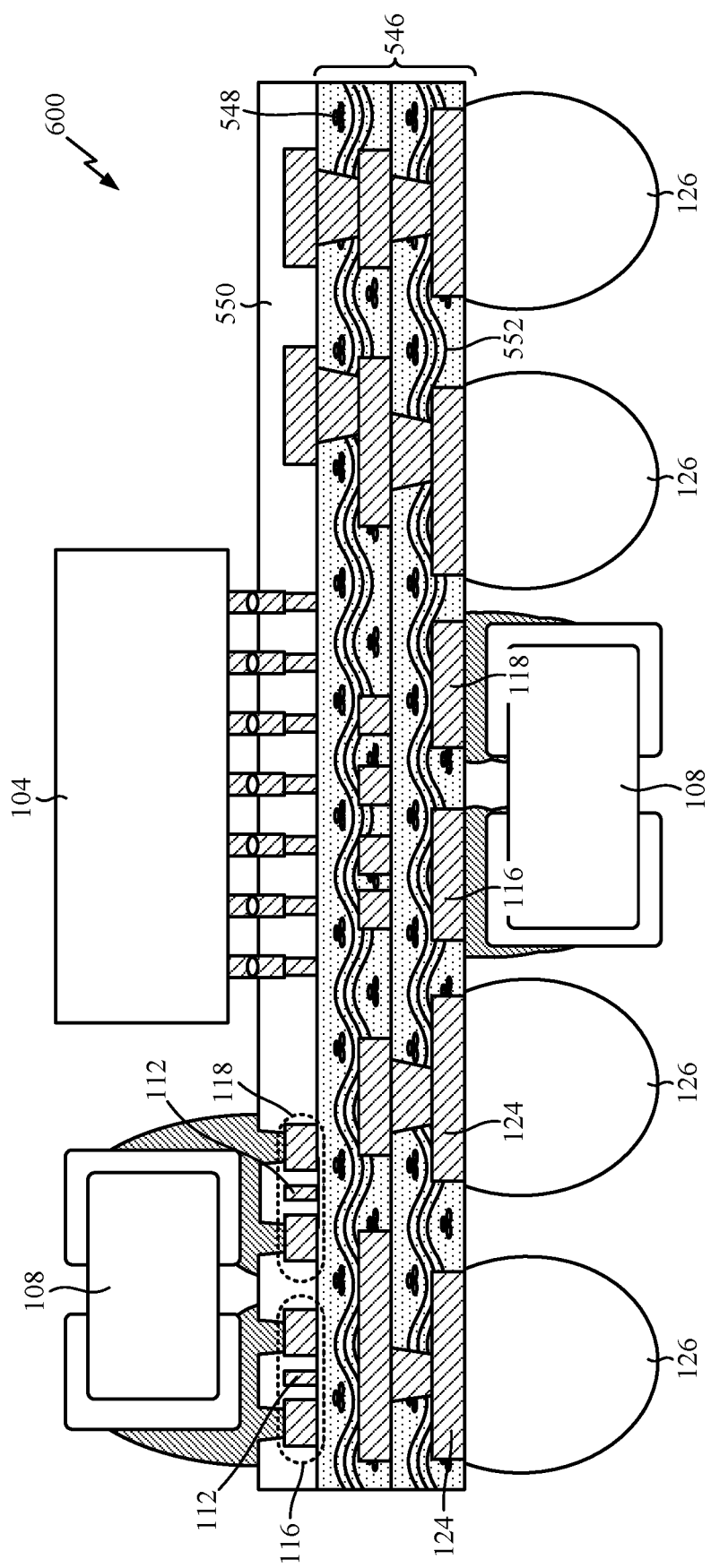
FIG. 6C is a cross-sectional view of an electrical component coupled to split conductive pads on a die-side of the laminate substrate, in accordance with certain aspects.

FIGS. 6A-6C illustrate example operations for fabricating a chip package with a coreless substrate having a split conductive pad, in accordance with certain aspects of the present disclosure. The operations may be performed by an integrated circuit packaging facility, for example.

As shown in FIG. 6A, the laminate substrate layers 546 may be formed on a chip carrier 556, which may provide a structure to form a coreless chip package. The chip carrier 556 may be a glass carrier or a silicon carrier with a copper foil. In certain aspects, the split conductive pads 116, 118 and conductive traces 112 may be formed on the first layer 548 for die-side mounting applications, as described herein with respect to FIG. 5A. In other aspects, the split conductive pads 116, 118 and the conductive traces 112 may be formed on the chip carrier 556 for land-side mounting applications as described herein with respect to FIG. 5B. Die pads 558 that provide a mounting surface for the die may also be formed on the layer 548.

As depicted in FIG. 6B, the layer of solder resist 550 may be formed on the layer 548. In certain aspects, a mask may be applied to pattern the layer of solder resist 550 such that the split conductive pads 116, 118 and die pads 558 are exposed. In other aspects, the layer of solder resist 550 may be formed over the split conductive pads 116, 118 and die pads 558, and cavities may be formed in the layer of solder resist 550 to expose the split conductive pads 116, 118 and die pads 558.

Referring to FIG. 6C, a chip package 600 is formed by removing the chip carrier, forming solder bumps 126 on the under bump conductors 124, and coupling the electrical component 108 to the split conductive pads 116, 118. Although the electrical component 108 is shown coupled to the split conductive pads 116, 118 on the die side, the electrical component 108 may also be coupled to split conductive pads on the land side of the chip package as depicted in FIG. 5B. In certain aspects, a layer of solder resist (e.g., the second layer of solder resist 554 of FIG. 5B) may be formed on the second layer 552 after removing the chip carrier.

In certain aspects, the electrical component may be coupled to the split conductive pads on the land side or die side of a chip package having a core substrate. For example, FIG. 7 illustrates a cross-sectional view of an example electrical component coupled to split conductive pads on a die side of a chip package 700 with a core substrate layer 760, in accordance with certain aspects of the present disclosure. As shown, the chip package 700 includes a core substrate layer 760, one or more first build-up layers 762, and one or more second build-up layers 764. The one or more first build-up layers 762 and one or more second build-up layers 764 may include patterned conductive layer(s) (e.g., conductive traces) and dielectric layer(s) (e.g., a glass layer pre-impregnated with epoxy resin (prepreg)).

The split conductive pads 116, 118 may be disposed on the one or more first build-up layers 762. A layer of solder resist 766 may be disposed above the one or more first build-up layers 762. The split conductive pads 116, 118 may provide improved routing options, signal integrity, and/or power distribution on the die side of the chip package 700. In certain aspects, the electrical components 108 may be mounted to the chip package with split conductive pads on the land side, die side, or a combination of die side and land side.

Figure 8A:
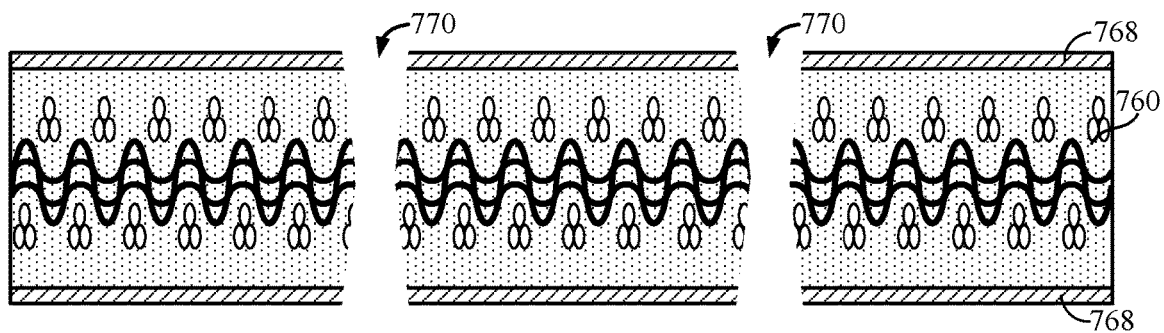
FIG. 8A is a cross-sectional view of a core substrate having cavities formed therein, in accordance with certain aspects of the present disclosure.
Figure 8B:
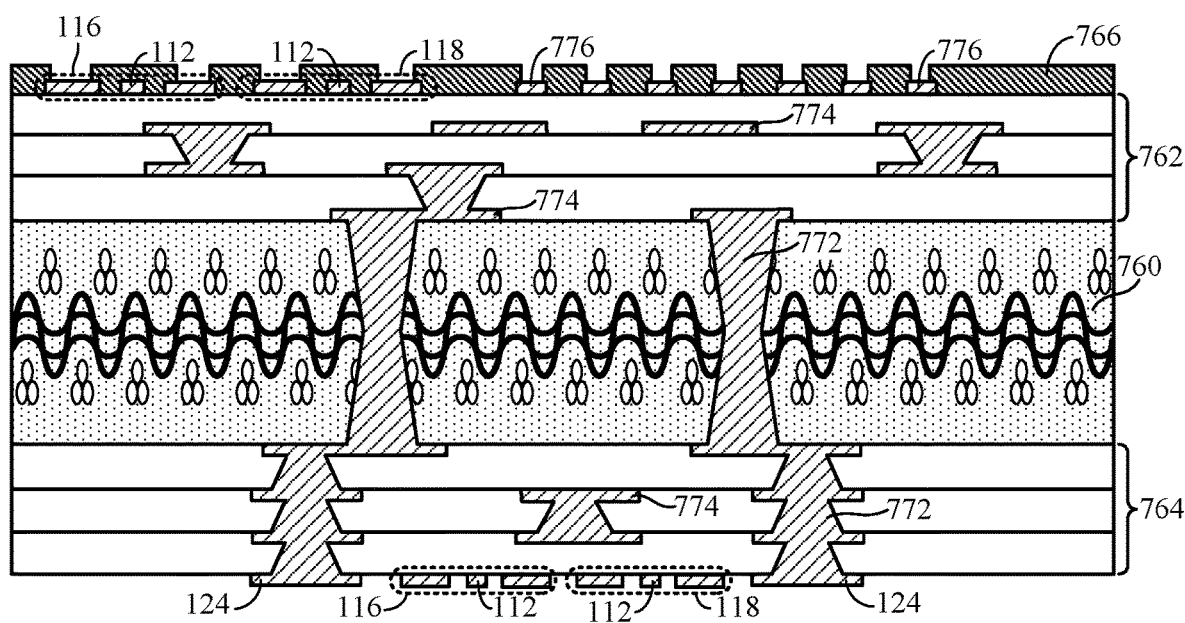
FIG. 8B is a cross-sectional view of split conductive pads formed on a die-side and land-side of chip package with a core substrate, in accordance with certain aspects of the present disclosure.

FIGS. 8A and 8B illustrate example operations for fabricating a chip package with a core substrate having a split conductive pad, in accordance with certain aspects of the present disclosure. The operations may be performed by an integrated circuit packaging facility, for example.

As shown in FIG. 8A, the core substrate 760 is formed. For example, the core substrate 760 may be a laminate core substrate, a printed circuit board substrate, a core resin, or a glass epoxy. Conductive foil layers 768 may be disposed above and below the core substrate 760. As shown, cavities 768 may be formed in the core substrate 760 to receive conductive vias as further described herein.

Referring to FIG. 8B, the one or more first build-up layers 762 may be formed above the core substrate 760, and the one or more second build-up layers 764 may be formed below the core substrate 760. Patterning of conductive via(s) 772 and trace(s) 774 may be performed on the substrate 760, the one or more first buildup layers 762, and the one or more second buildup layers 764. As shown, the split conductive pads 116, 118 may be disposed above the one or more first build-up layers 762 and/or the below the one or more second build-up layers 764. Die pads 776 that provide a mounting surface for the die may be formed on one of the first build-up layers 762.

The layer of solder resist 766 may be formed on the one or more first build-up layers 762. In certain aspects, a mask may be applied to pattern the layer of solder resist 766 such that the split conductive pads 116, 118 and die pads 776 are exposed. In other aspects, the layer of solder resist 766 may be formed over the split conductive pads 116, 118 and die pads 776, and cavities may be formed in the layer of solder resist 766 to expose the split conductive pads 116, 118 and die pads 776.

The chip package 700 of FIG. 7 may be formed by forming solder bumps on the under bump conductors 124, coupling the electrical component to the split conductive pads 116, 118, and coupling the die to the die pads 776.

Figure 9:
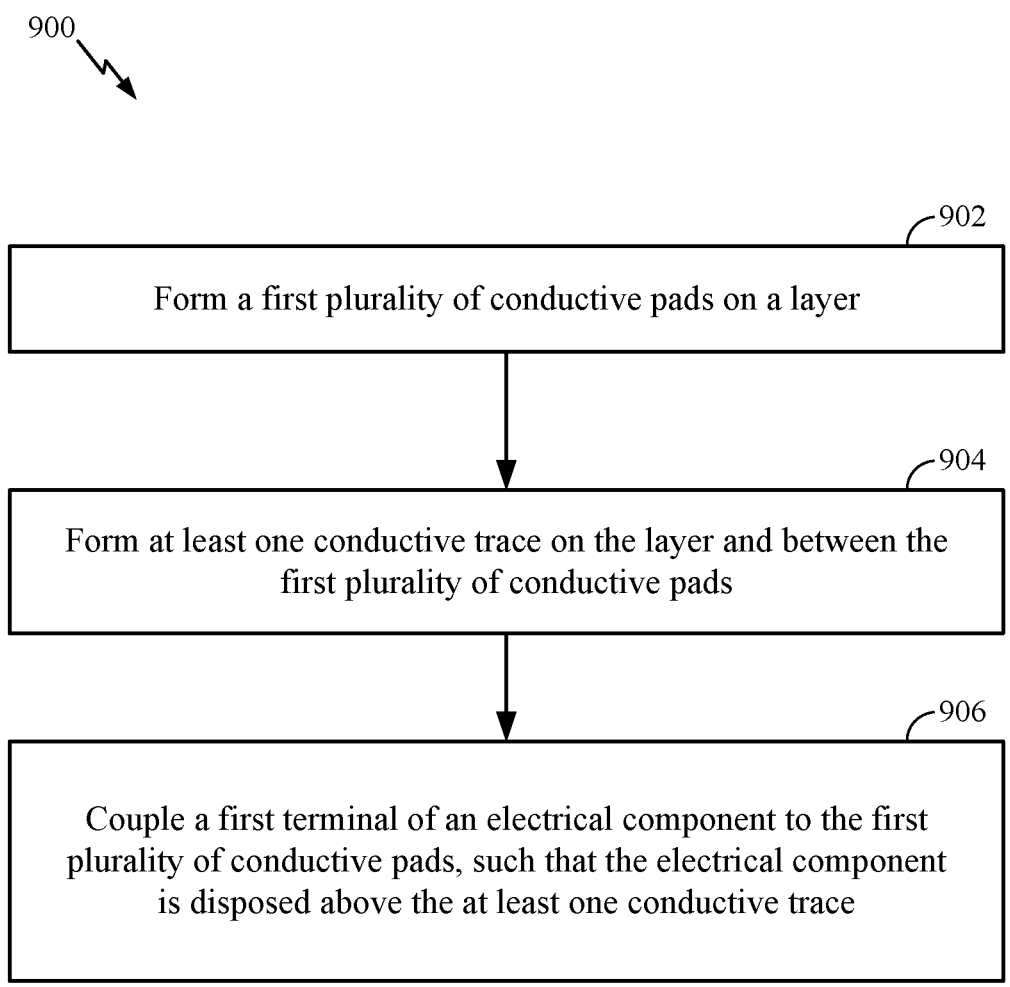
FIG. 9 is a flow diagram of example operations for fabricating a chip package, in accordance with certain aspects of the present disclosure.

FIG. 9 is a flow diagram of example operations 900 for fabricating a chip package (e.g., the chip package 100 of FIG. 1, the chip package 500 of FIGS. 5A and 5B, or the chip package 700 of FIG. 7), in accordance with certain aspects of the present disclosure. The operations 900 may be performed by an integrated circuit packaging facility, for example.

The operations 900 begin, at block 902, by forming a first plurality of conductive pads (e.g., the first plurality of conductive pads 110 composing split conductive pad 116) on a layer (e.g., the layer 114, the second dielectric layer 338, the first layer 548, or the second layer 552). At block 904, at least one conductive trace (e.g., the conductive trace 112) may be formed on the layer and between the first plurality of conductive pads. At block 906, a first terminal (e.g., the first terminal 109) of an electrical component (e.g., the electrical component 108) may be coupled to the first plurality of conductive pads, such that the electrical component is disposed above the at least one conductive trace.

In certain aspects, the operations 900 may further include forming one or more redistribution layers (e.g., the one or more redistribution layers 106, 306, 546) comprising the layer, such that the electrical component is at least partially disposed above the layer.

In certain aspects, the operations 900 may further include forming a second plurality of conductive pads (e.g., the second plurality of conductive pads 110 composing split conductive pad 118) on the layer and coupling a second terminal (e.g., the second terminal 111) of the electrical component to the second plurality of conductive pads.

In certain aspects, the operations 900 may further include forming at least one other conductive trace (e.g., the conductive trace 112) on the layer and between the second plurality of conductive pads, such that the second terminal is disposed above the at least one other conductive trace.

In certain aspects, the operations 900 may further include forming a layer of solder resist (e.g., the layer of solder resist 140, 550, 554 or the third dielectric layer 340) above the layer and between the at least one conductive trace and the first terminal. At least one cavity may be formed in the layer of solder resist. For example, a first cavity and a second cavity may be formed in the layer of solder resist. Coupling the first terminal may include coupling the first terminal to the first plurality of conductive pads in the first cavity, and coupling the second terminal may include coupling the second terminal to the second plurality of conductive pads in the second cavity, for example, as depicted in FIGS. 2A and 2B.

In certain aspects, the operations 900 may further include forming conductive via pads (e.g., the conductive via pads 132) on the layer. A power distribution pad (e.g., the power distribution pad 134) may be formed on the layer, such that the power distribution pad is disposed around at least one of the conductive via pads, for example, as depicted in FIG. 2C. The second terminal of the electrical component may be coupled to the conductive via pads, such that the second terminal is disposed above the power distribution pad.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A chip package comprising:
   a layer;
   a first plurality of conductive pads disposed on the layer;
   at least one conductive trace disposed on the layer and between the first plurality of conductive pads without the at least one conductive trace being electrically shorted to the first plurality of conductive pads; and
   an electrical component having a first terminal coupled to the first plurality of conductive pads and disposed above the at least one conductive trace, wherein the first plurality of conductive pads are electrically shorted together.

2. The chip package of claim 1, further comprising one or more redistribution layers including the layer, wherein the electrical component is at least partially disposed above the layer.

3. The chip package of claim 1, further comprising a second plurality of conductive pads disposed on the layer, wherein the electrical component has a second terminal coupled to the second plurality of conductive pads.

4. The chip package of claim 3, further comprising at least one other conductive trace disposed on the layer and between the second plurality of conductive pads, wherein the second terminal is disposed above the at least one other conductive trace.

5. The chip package of claim 3, wherein the at least one conductive trace is disposed between the second plurality of conductive pads, and wherein the second terminal is disposed above the at least one conductive trace.

6. The chip package of claim 3, further comprising a layer of solder resist disposed above the layer and between the at least one conductive trace and the first terminal.

7. The chip package of claim 6, wherein:
   the layer of solder resist has at least one cavity therein; and
   the first terminal is disposed in the at least one cavity.

8. The chip package of claim 7, wherein:
   the at least one cavity comprises a first cavity and a second cavity;
   the first terminal is disposed in the first cavity; and
   the second terminal is disposed in the second cavity.

9. The chip package of claim 1, further comprising:
   conductive via pads disposed on the layer; and
   a power distribution pad disposed on the layer and around at least one of the conductive via pads, wherein the electrical component has a second terminal coupled to the conductive via pads and at least partially disposed above the power distribution pad.

10. The chip package of claim 1, wherein the electrical component is a passive surface-mount electrical device.

11. A method of fabricating a chip package, comprising:
forming a first plurality of conductive pads on a layer;
forming at least one conductive trace on the layer and between the first plurality of conductive pads without the at least one conductive trace being electrically shorted to the first plurality of conductive pads; and
coupling a first terminal of an electrical component to the first plurality of conductive pads, wherein the electrical component is disposed above the at least one conductive trace and wherein the first plurality of conductive pads are electrically shorted together.

12. The method of claim 11, further comprising forming one or more redistribution layers comprising the layer, wherein the electrical component is at least partially disposed above the layer.

13. The method of claim 11, further comprising:
forming a second plurality of conductive pads on the layer; and
coupling a second terminal of the electrical component to the second plurality of conductive pads.

14. The method of claim 13, further comprising forming at least one other conductive trace on the layer and between the second plurality of conductive pads, wherein the second terminal is disposed above the at least one other conductive trace.

15. The method of claim 13, wherein forming the at least one conductive trace comprises forming the at least one conductive trace between the second plurality of conductive pads, and wherein the second terminal is disposed above the at least one conductive trace.

16. The method of claim 13, further comprising forming a layer of solder resist above the layer and between the at least one conductive trace and the first terminal.

17. The method of claim 16, further comprising forming at least one cavity in the layer of solder resist, wherein coupling the first terminal comprises coupling the first terminal to the first plurality of conductive pad in the at least one cavity.

18. The method of claim 16, further comprising forming a first cavity and second cavity in the layer of solder resist, wherein:
coupling the first terminal comprises coupling the first terminal to the first plurality of conductive pads in the first cavity; and
coupling the second terminal comprises coupling the second terminal to the second plurality of conductive pads in the second cavity.

19. The method of claim 11, further comprising:
forming conductive via pads on the layer;
forming a power distribution pad on the layer and around at least one of the conductive via pads; and
coupling a second terminal of the electrical component to the conductive via pads, wherein the second terminal is disposed above the power distribution pad.

20. The chip package of claim 4, wherein:
the at least other conductive trace is disposed between the second plurality of conductive pads without the at least one other conductive trace being electrically shorted to the second plurality of conductive pads; and
the second plurality of conductive pads are electrically shorted together.

\* \* \* \* \*